(12) United States Patent
Little et al.

(10) Patent No.: US 9,281,629 B2
(45) Date of Patent: *Mar. 8, 2016

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Stephen Sedio, Valley Center, CA (US); Chih-Pi Cheng, New Taipei (TW); Yuan Zhang, Rowland-Heights, CA (US); De-Cheng Zou, Monterey Park, CA (US); An-Jen Yang, Irvine, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/565,453

(22) Filed: Dec. 10, 2014

(65) Prior Publication Data

US 2015/0093936 A1  Apr. 2, 2015

Related U.S. Application Data

(63) Continuation-in-part of application No. 14/497,205, filed on Sep. 25, 2014, which is a continuation-in-part of application No. 14/477,889, filed on Sep. 5, 2014, which is a continuation-in-part of application No.

(Continued)

(51) Int. Cl.
*H01R 24/00* (2011.01)
*H01R 13/6583* (2011.01)
*H01R 12/72* (2011.01)
*H01R 12/75* (2011.01)
*H01R 13/6594* (2011.01)

(52) U.S. Cl.
CPC .......... *H01R 13/6583* (2013.01); *H01R 12/724* (2013.01); *H01R 12/75* (2013.01); *H01R 13/6594* (2013.01)

(58) Field of Classification Search
CPC .................... H01R 23/7073; H01R 23/7005
USPC .............. 439/660, 626, 374, 377, 79, 733
See application file for complete search history.

(56) References Cited

U.S. PATENT DOCUMENTS

| | | | |
|---|---|---|---|
| 6,755,689 | B2 | 6/2004 | Zhang et al. |
| 7,758,379 | B2 | 7/2010 | Chen |
| 8,087,944 | B2 | 1/2012 | Kumamoto et al. |

(Continued)

FOREIGN PATENT DOCUMENTS

| | | |
|---|---|---|
| CN | 202423735 | 9/2012 |
| CN | 202737282 | 2/2013 |
| TW | M454654 | 6/2013 |

*Primary Examiner* — Phuongchi T Nguyen
(74) *Attorney, Agent, or Firm* — Wei Te Chung; Ming Chieh Chang

(57) ABSTRACT

A receptacle connector mounted to the printed circuit board, includes an insulative housing defining a mating tongue and a metallic shell enclosing the housing to form a mating cavity in which said mating tongue forwardly extends. A complementary plug connector includes a shell with a bull-nose tip. A metallic piece is mounted around a root of the mating tongue and equipped with a plurality of spring tangs to contact the relatively rigid bull-nose tip of the shell of the complementary connector for EMI/RFI protection.

8 Claims, 33 Drawing Sheets

Related U.S. Application Data

14/454,737, filed on Aug. 8, 2014, which is a continuation-in-part of application No. 14/337,180, filed on Jul. 21, 2014, application No. 14/565,453, which is a continuation-in-part of application No. 14/517,941, filed on Oct. 20, 2014.

(60) Provisional application No. 61/919,681, filed on Dec. 20, 2013, provisional application No. 61/927,951, filed on Jan. 15, 2014, provisional application No. 61/930,945, filed on Jan. 23, 2014, provisional application No. 61/916,147, filed on Dec. 14, 2013, provisional application No. 61/926,270, filed on Jan. 11, 2014, provisional application No. 61/917,363, filed on Dec. 18, 2013, provisional application No. 61/949,232, filed on Mar. 6, 2014, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(56) References Cited

U.S. PATENT DOCUMENTS

| | | |
|---|---|---|
| 8,517,773 B2 | 8/2013 | Lee et al. |
| 8,968,031 B2 | 3/2015 | Simmel et al. |
| 2013/0095702 A1 | 4/2013 | Golko et al. |
| 2015/0024612 A1* | 1/2015 | Little ............ H05K 1/02 439/55 |
| 2015/0044886 A1* | 2/2015 | Little ............ H01R 12/75 439/55 |
| 2015/0072562 A1* | 3/2015 | Little ............ H01R 13/6658 439/607.55 |
| 2015/0093936 A1* | 4/2015 | Little ............ H01R 13/6583 439/607.19 |
| 2015/0126069 A1* | 5/2015 | Little ............ H01R 13/6581 439/607.55 |
| 2015/0162684 A1 | 6/2015 | Amini et al. |
| 2015/0171562 A1 | 6/2015 | Gao et al. |
| 2015/0171573 A1* | 6/2015 | Little ............ H01R 24/60 439/607.34 |
| 2015/0171574 A1* | 6/2015 | Little ............ H01R 24/60 439/78 |
| 2015/0214673 A1 | 7/2015 | Gao et al. |
| 2015/0214674 A1 | 7/2015 | Simmel et al. |

* cited by examiner

FLIPPABLE ELECTRICAL CONNECTOR

CROSS REFERENCE TO RELATED APPLICATIONS

This application is a continuation-in-part application of Ser. No. 14/477,889 filed Sep. 5, 2014, of Ser. No. 14/497,205 filed Sep. 25, 2014, and of Ser. No. 14/517,941 filed Oct. 20, 2014, and claims the benefit of, and priority to, U.S. Provisional Patent Application No. 61/919,681, filed Dec. 20, 2013, Provisional Patent Application No. 61/927,951, filed Jan. 15, 2014 and Provisional Patent Application No. 61/930,945, filed Jan. 23, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degredation in the super speed signals. Recently, in comparison with the so-called external shielding effect during mating by means of the metallic outer shell of the plug connector enclosed in the metallic outer shielding of the receptacle connector, an attempt by others enhancing the shielding effect was made to provide additionally the so-called internal shielding effect between the receptacle connector and the plug connector during mating by providing a metallic collar around the root portion of the mating tongue of the receptacle connector and a pair of metallic spring plates under the shell of the plug connector to mechanically and electrically connect to the collar of the receptacle connector, wherein such a collar includes a rear section mechanically and electrically connected to an interior surface of the shielding. Anyhow, in such others' design, the collar of the receptacle connector is stiff and stationary, thus inevitably requiring the pair of spring plates provided by the plug connector for intimately coupling.

Hence, a simple structure of the electrical plug connector and that the complementary receptacle connector with less parts are desired.

SUMMARY OF THE INVENTION

Accordingly, the object of the present invention is to provide a receptacle connector adapted for engagement with a complementary plug connector, comprising: an insulative housing defining a base and a mating tongue forwardly extending therefrom, the mating tongue defining a step structure about a root thereof; a plurality of contacts disposed in the housing with contacting sections exposed upon the mating tongue; a metallic shell enclosing the housing to define a mating cavity in which the mating tongue is disposed; and an EMI element being assembled to the base to cover opposite top and bottom surfaces; wherein the EMI element defines a plurality of spring tangs to be seated upon a rear portion of the mating tongue so as to allow a bull-nose tip of a shell of the complementary plug connector to abut against an exterior surface or an interior surface of the spring tang for EMI/RFI protection.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
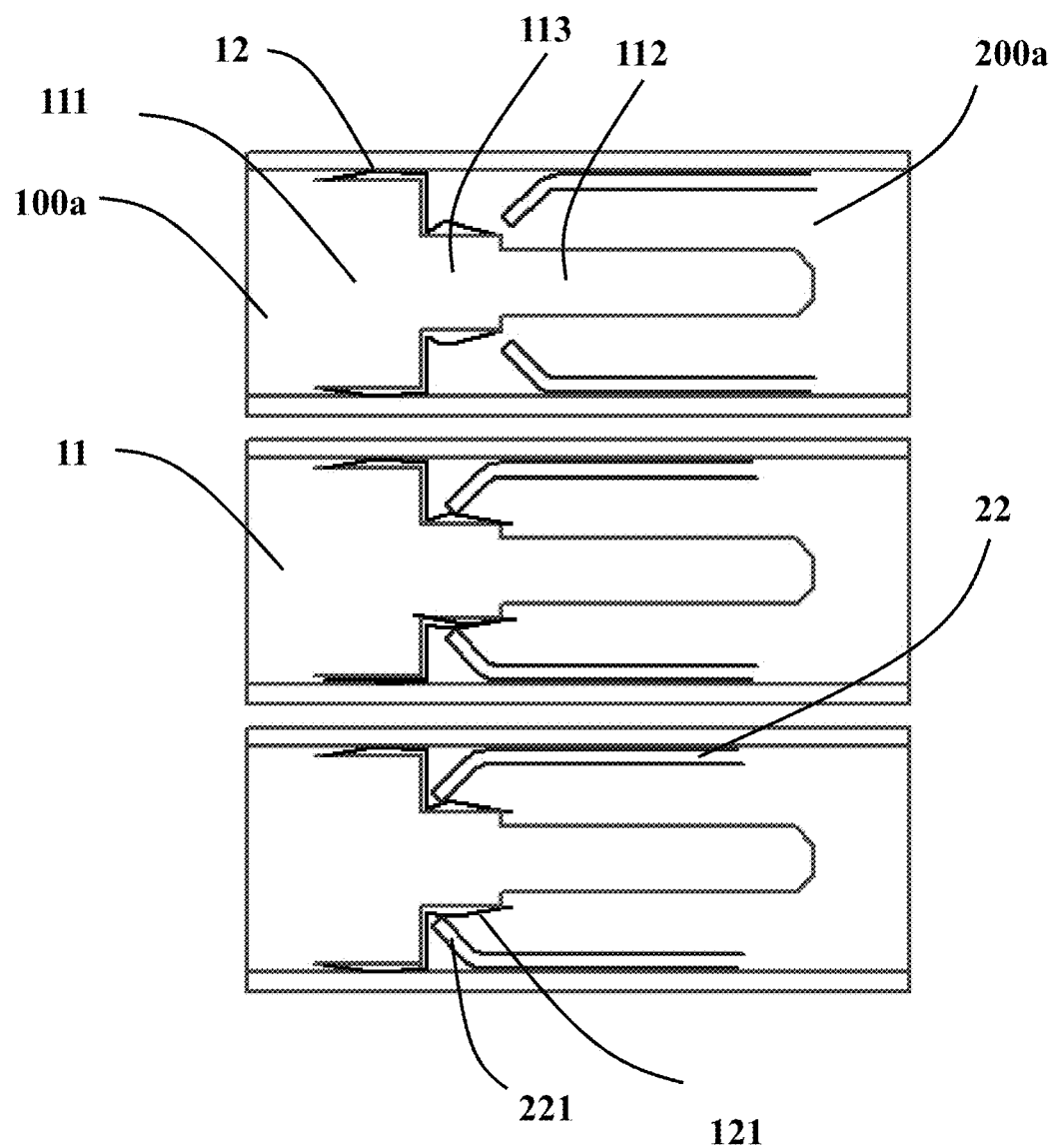
FIG. 1 is an illustrative side view of a receptacle connector of a first embodiment, showing how the receptacle connector is inserted with a plug connector in sequence.

FIG. 1 shows a receptacle connector 100a of a first embodiment of this instant invention, showing how the receptacle connector 100a is mated with a plug connector. The housing 11 of the receptacle connector 100a include base 111 and a mating tongue 112 forwardly extending therefrom wherein the rear portion of the mating tongue 112 defines a step structure 113 thereof. A one piece U-shaped metallic plate 12 (i.e., a side view) is rearwardly assembled to the base 111 to cover the opposite top and bottom faces and a front face of the base 111 wherein vertical portions of the metallic plate 12 were split therefrom to form top and bottom spring fingers 121 essentially seated upon the step structure 113. The bull-nose tip 221 of the metallic shell 22 of the complementary plug connector 200a abuts against the exterior surfaces of said spring fingers 121 for EMI/RFI protection.

Figure 2:
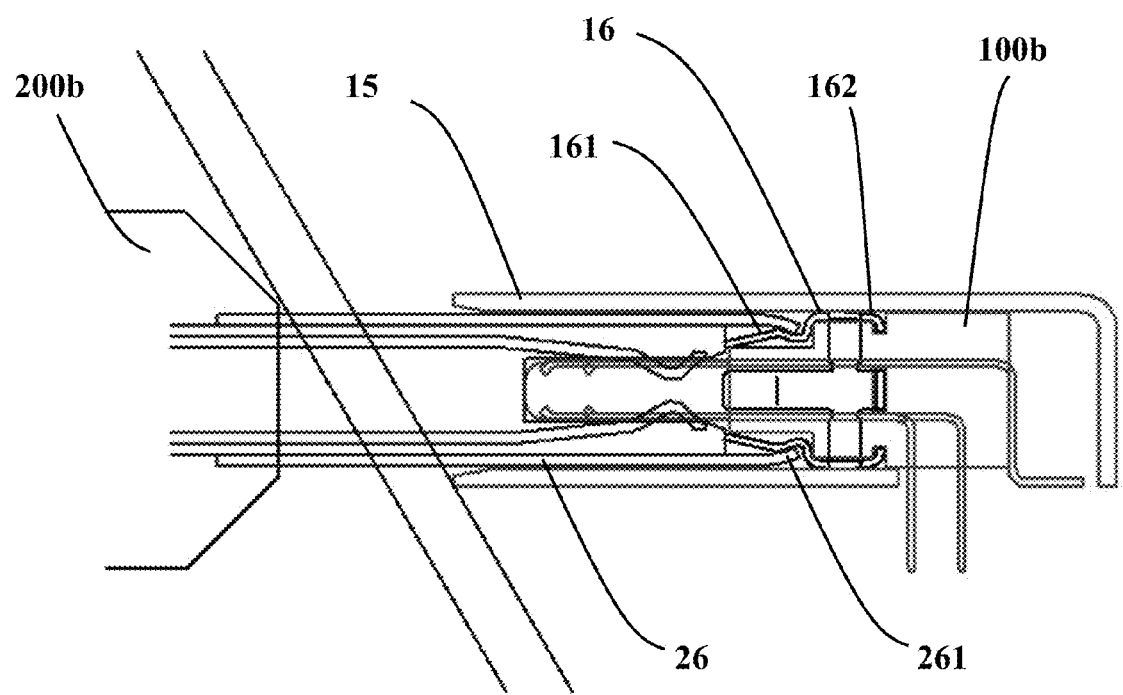
FIG. 2 is an illustration side view of a receptacle connector and a plug connector mated with each other of a second embodiment.
Figure 3:
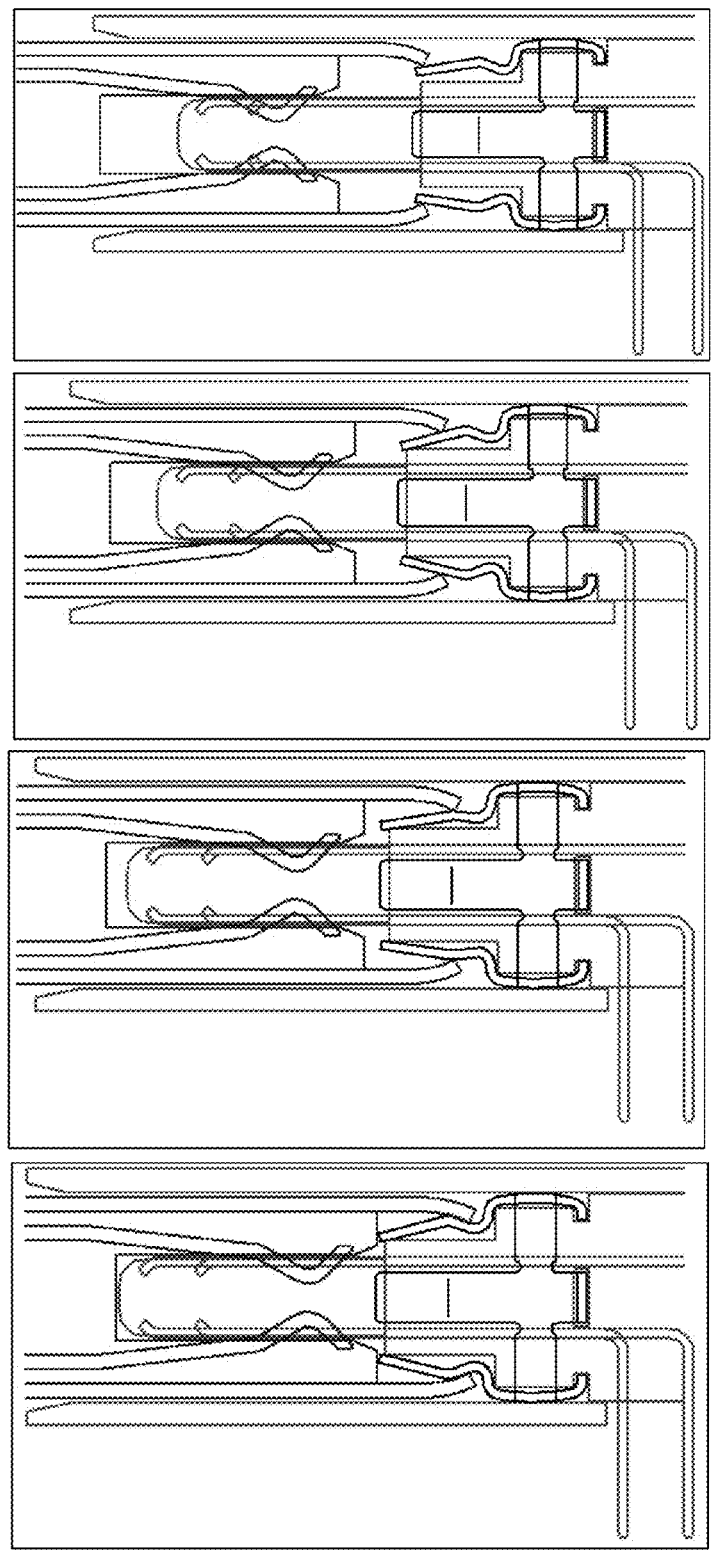
FIG. 3 is an illustration side view to show how the plug connector is mated with the receptacle connector of FIG. 2 in sequence.
Figure 4:
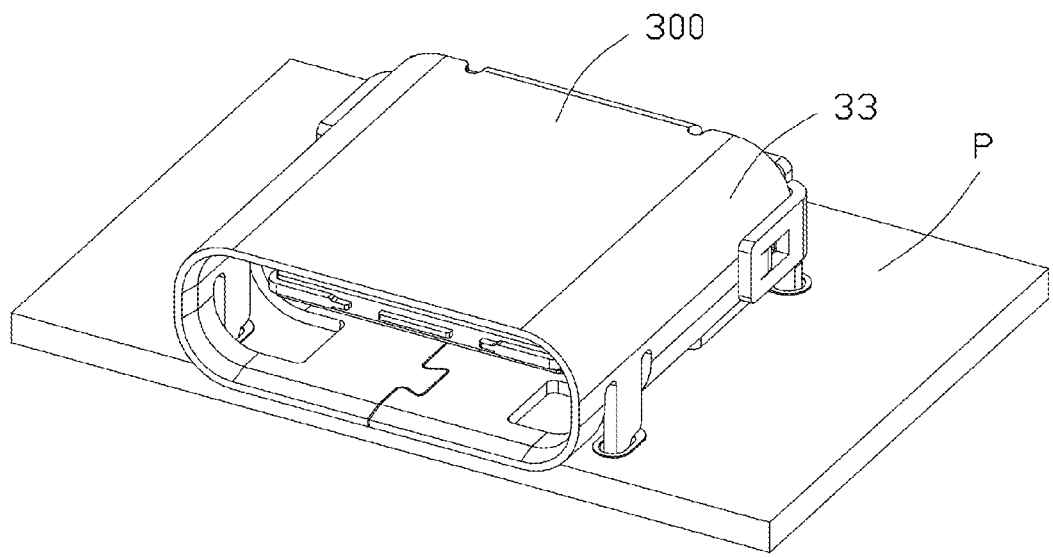
FIG. 4 is an assembled perspective view of a receptacle connector of a third embodiment mounted on a printed circuit board.

FIG. 2 shows a receptacle connector 100b and a plug connector 200b mated with each other of a second embodiment of this instant invention. FIG. 3 shows how the receptacle connector 100b is mated with the plug connector 200b. The receptacle connector 100b includes a pair of metallic bracelets 16 each defines a U-shaped structure assembled to the base. In this embodiment, the bracelets 16 are assembled to the base sidewardly instead of rearwardly. The spring fingers 161 are able to be a complete manner without necessity to be alternately arranged with each other in two rows, and the rear portions 162 of the bracelets 16 abut against the metallic shell 15 of the receptacle connector 100b. The spring fingers 161 are inserted into the plug connector 200b to contact the interior side of the bull-nose tip 261 of the shell 26 of the plug connector 200b.

Figure 5:
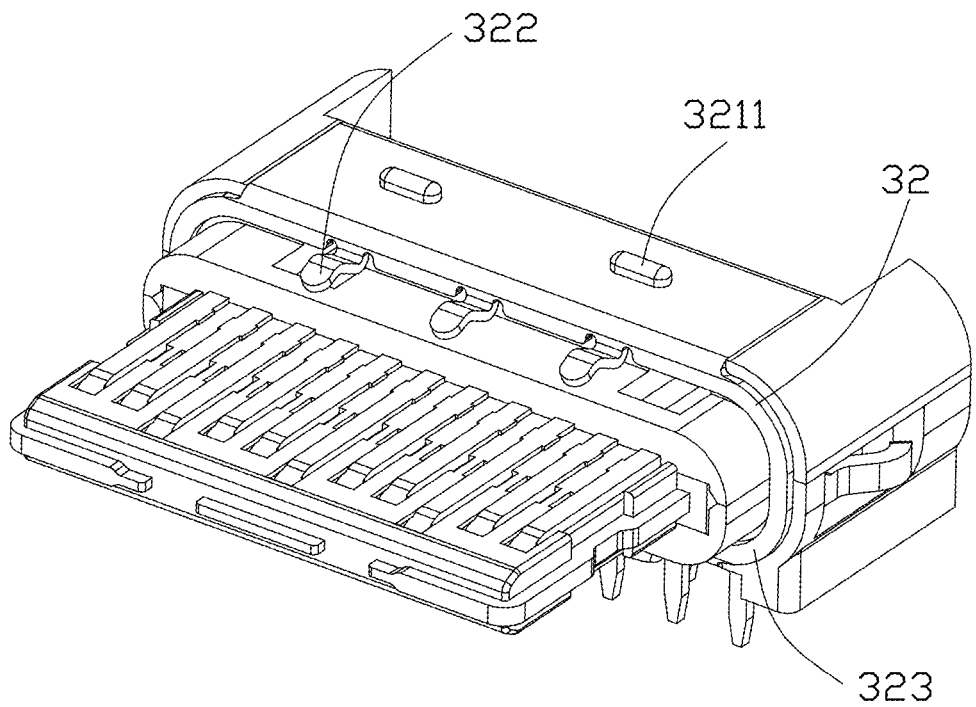
FIG. 5 is an assembled perspective view of a terminal seat and an EMI bracelet of the receptacle connector of FIG. 4.
Figure 6:
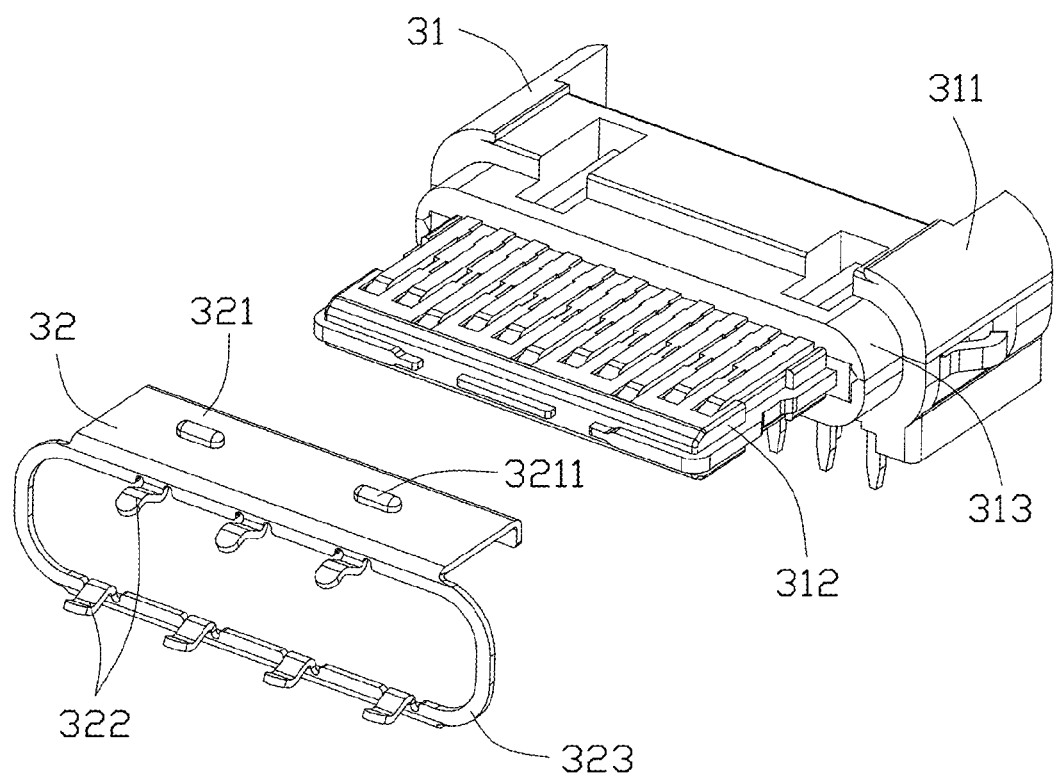
FIG. 6 is an exploded perspective view of the terminal seat and the EMI bracelet of FIG. 5.
Figure 7:
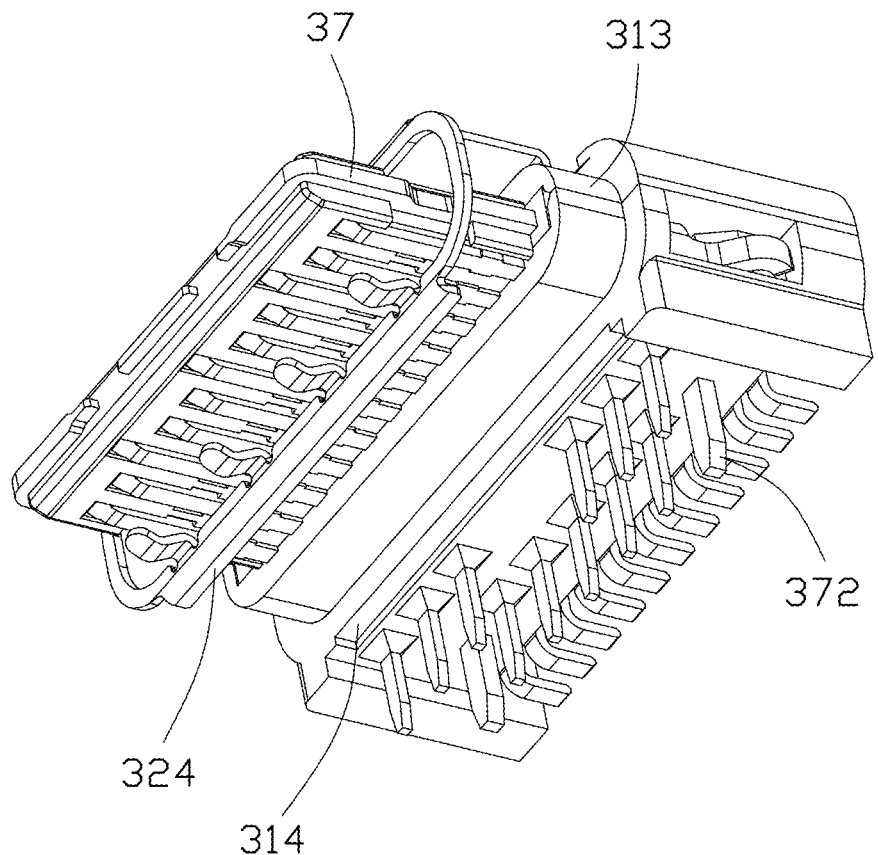
FIG. 7 is similar to FIG. 6, wherein the EMI bracelet is being assembled to the terminal seat.
Figure 8:
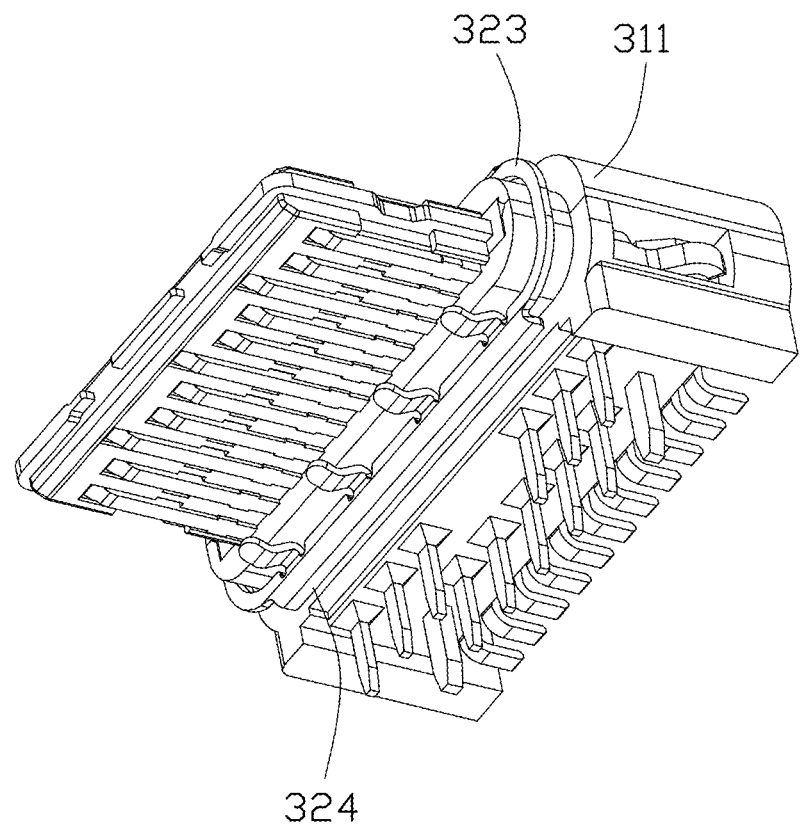
FIG. 8 is similar to FIG. 7, the bracelet is assembled to the step structure.
Figure 9:
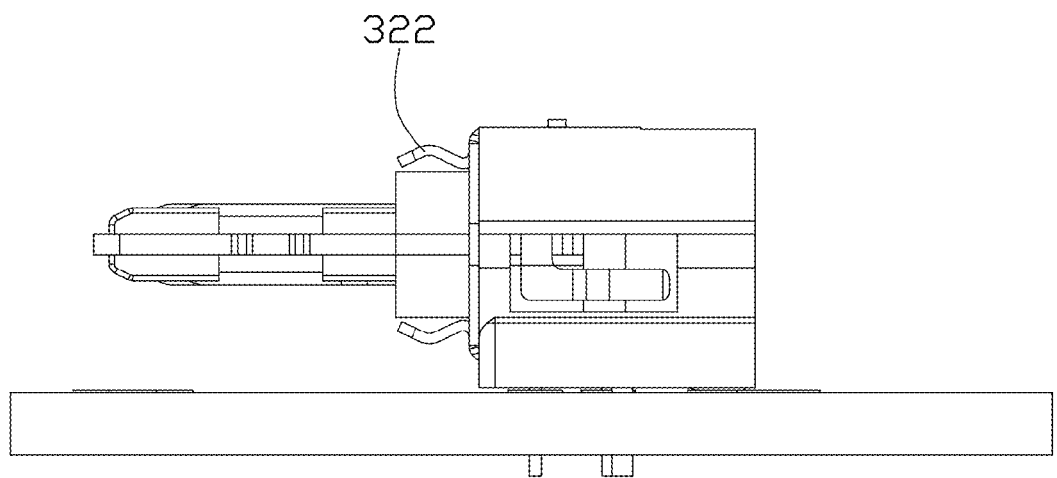
FIG. 9 is a side illustration view of the terminal seat and the EMI collar of FIG. 8 mounted on the printed circuit board.
Figure 10:
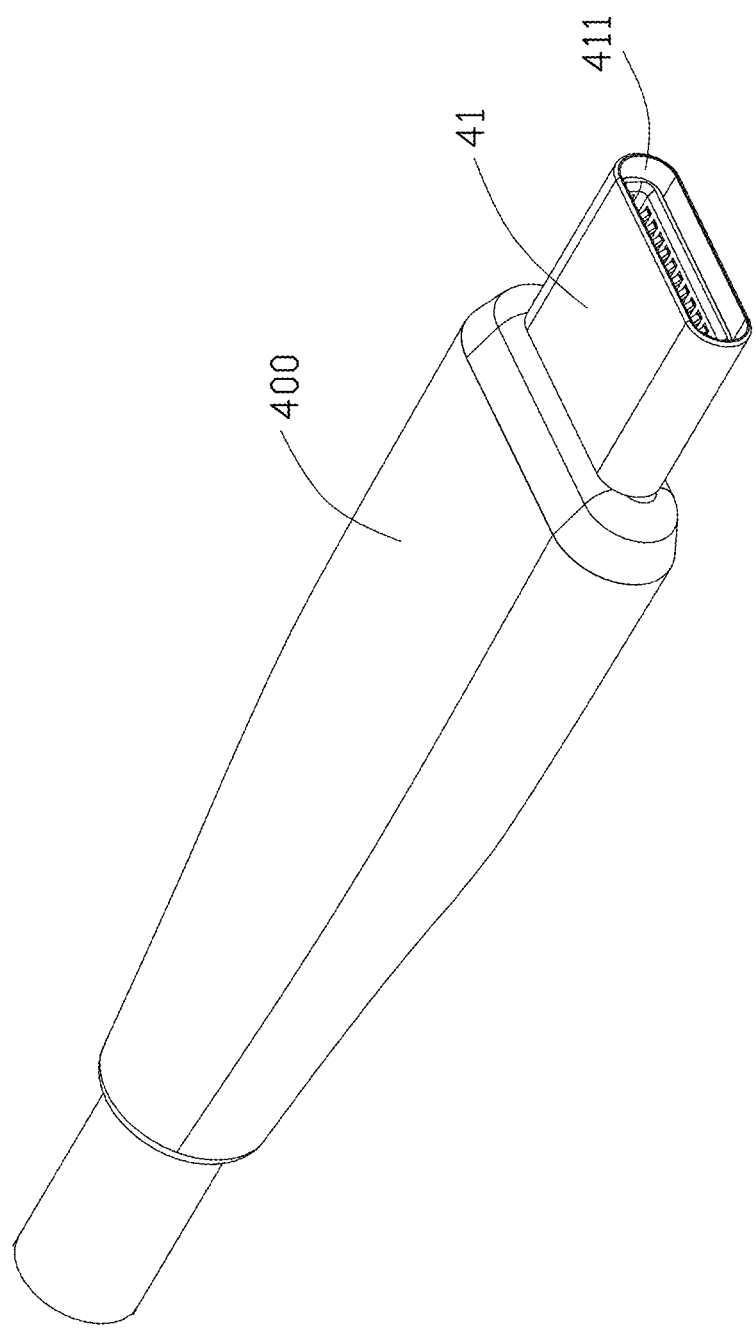
FIG. 10 is an assembled perspective view of a plug connector for mating with the receptacle connector of FIG. 4.
Figure 11:
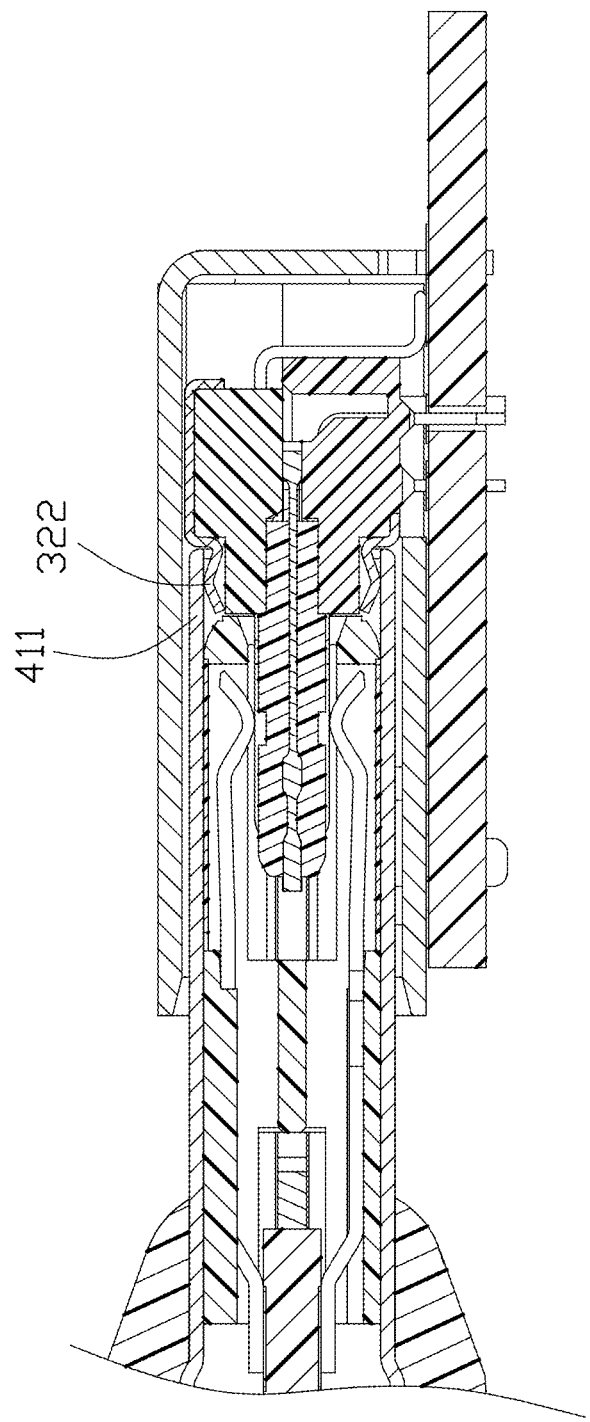
FIG. 11 is a cross-sectional view of the mated plug connector of FIG. 10 and the receptacle connector of FIG. 4.

FIGS. 4-9 show a receptacle connector 300 of a third embodiment of the invention wherein the receptacle connector 300 is mounted upon the printed circuit board (PCB) P and includes an insulative housing 31 composed of a base 311 and a mating tongue 312 forwardly extending therefrom with a step structure 313 around a root area of the mating tongue 312. A plurality of contacts is disposed on the insulative housing to form a terminal seat. As best shown in FIGS. 5 and 6, a metallic EMI bracelet 32 is secured to the base 311 and includes a retention plate 321 with bumps 3211 thereon to contact the metallic shell 33 of the receptacle connector 300, and a plurality of spring fingers 322 extending from a frame structure 323 commonly surrounding the step structure 313 so as to contact the inner surface of the extended tip section 411 of the metallic shell 41 of a plug connector 400 for EMI/RFI protection as shown in FIGS. 10 and 11. The bracelet 33 includes a hook structure 324 retained in the corresponding slot 314 of the base 311 as shown in FIG. 7. As best shown in FIGS. 7-9, the bracelet 33 is assembled to the insulating housing 31 along a front-to-rear direction, when the bracelet 33 arrives at the step structure 313, the hook structure 324 is firstly assembled to the slot 314 and then the frame structure 323 is pushed to abut against a front face of thee base 311 so that the retention plate 31 is retained to a top of the base 311.

Figure 12:
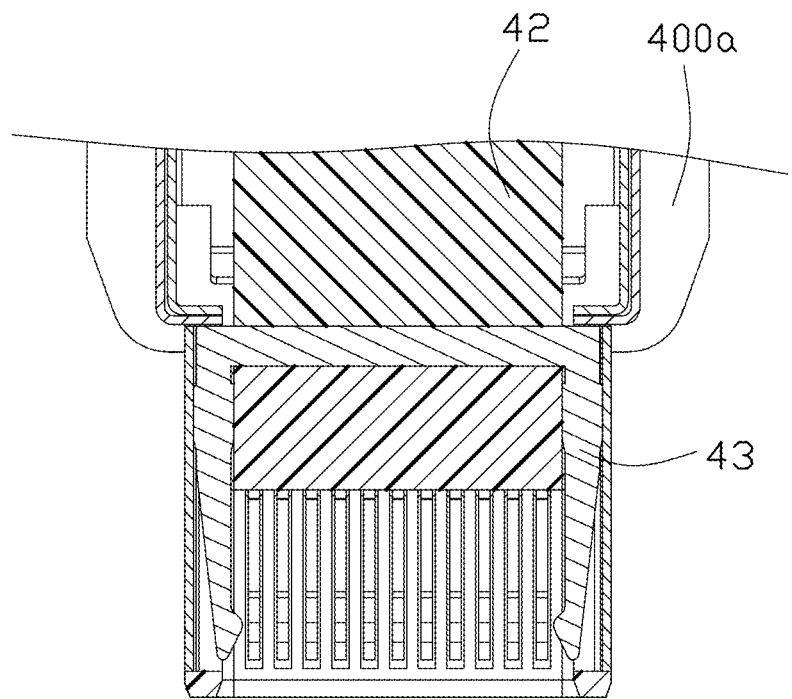
FIG. 12 is a cross-sectional illustrating view of a plug connector of another embodiment similar to FIG. 10, which includes a card paddle.
Figure 13:
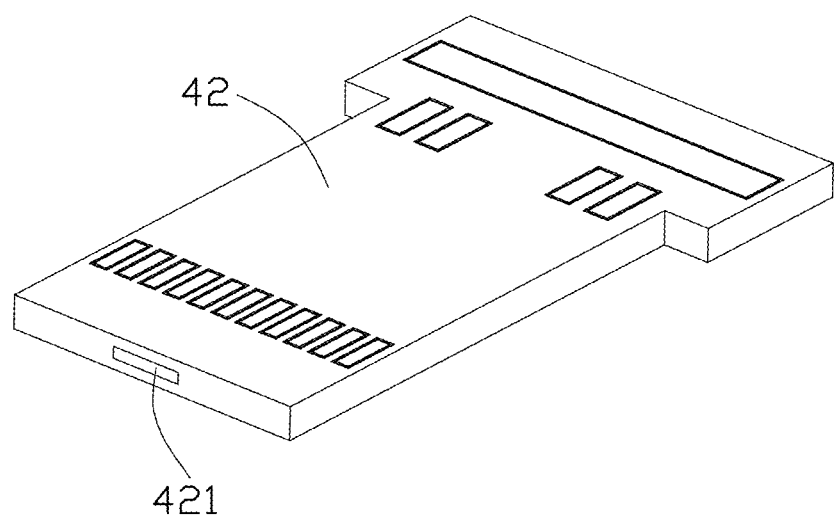
FIG. 13 shows the paddle card of the plug connector.

FIGS. 12-13 show an improved plug connector 400a of another embodiment, which has a paddle card 42 with a grounding pad 421 around the front edge so as to have the rear edge of the corresponding latch 43 mechanically and electrically connected thereto. During mating, a front hook section (not labeled) of the latch 43 may mechanically and electrically connect to the corresponding lateral notches (not labeled) in the shielding plate 37 shown in FIG. 7 of the mated receptacle connector 300 wherein the shielding plate has legs 372 mounted to the printed circuit board on which the receptacle connector is seated.

Figure 14:
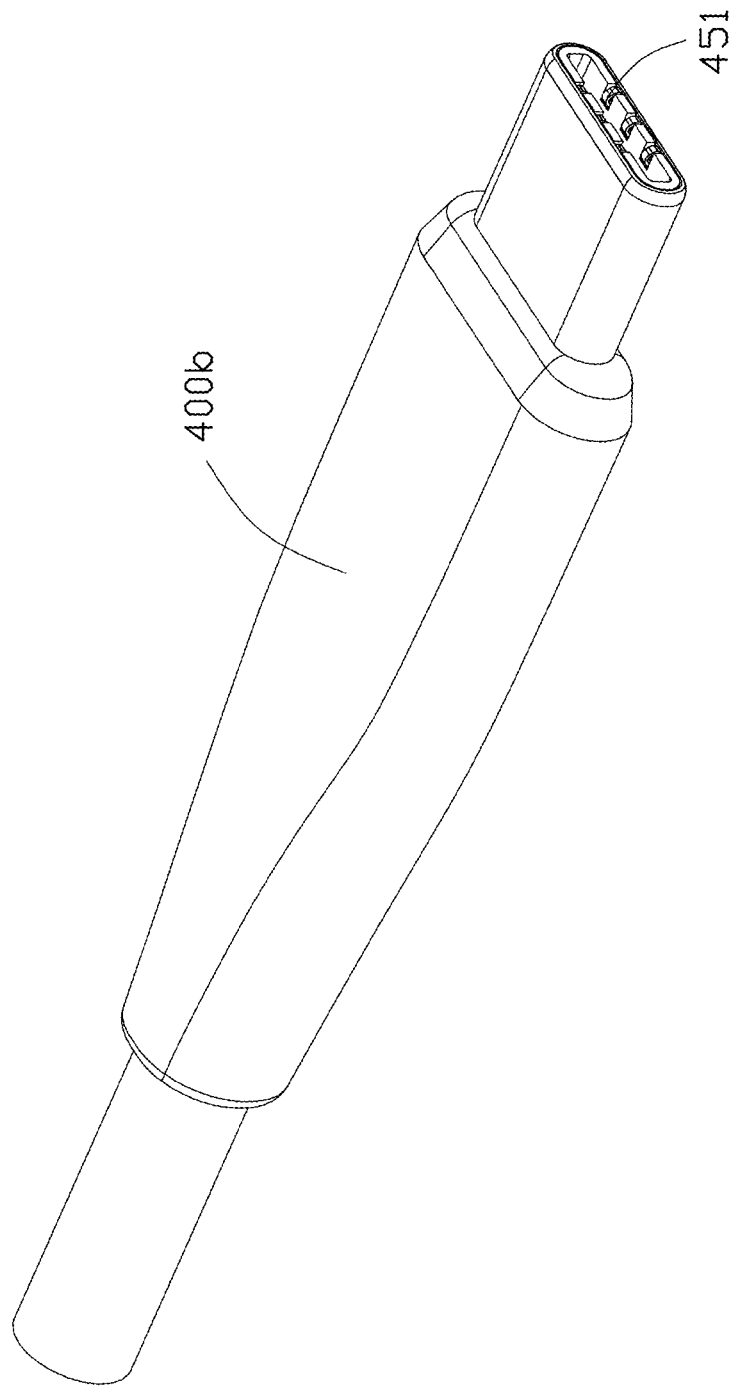
FIG. 14 is an assembled perspective view of a plug connector of a fourth embodiment of the instant invention.
Figure 15:
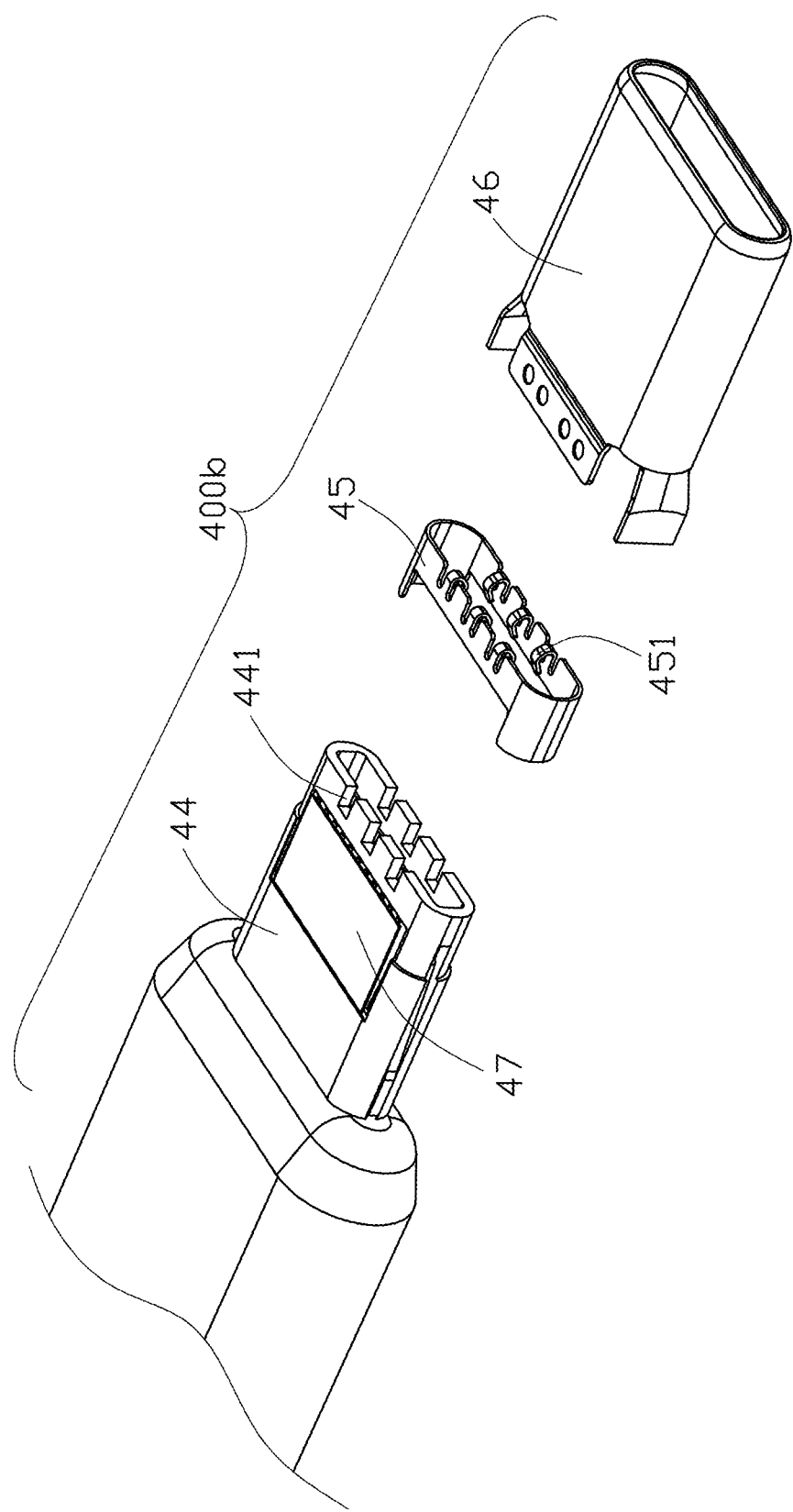
FIG. 15 is an exploded perspective view of the plug connector of FIG. 14.

FIGS. 14-15 show a plug connector 400b of a fourth embodiment, which includes an insualtive housing 44 with a metallic EMI bracelet 45 circumferentially attached upon a front end thereof. The EMI bracelet 45 forms a plurality of inwardly extending spring fingers 451 through the corresponding cutout 441 in the housing 44 into the corresponding mating port. A metallic shell 46 encloses the housing 44 to sandwich the bracelet 45 therebetween. An insulative film 47 is circumferentially attached upon a rear area of the housing to protect the contacts from touching the shell. Therefore, during mating with a corresponding receptacle connector, the spring fingers 451 may inwardly abut against the collar structure of the EMI piece located on a step structure formed on a root area of the mating tongue of the receptacle connector.

Figure 16:
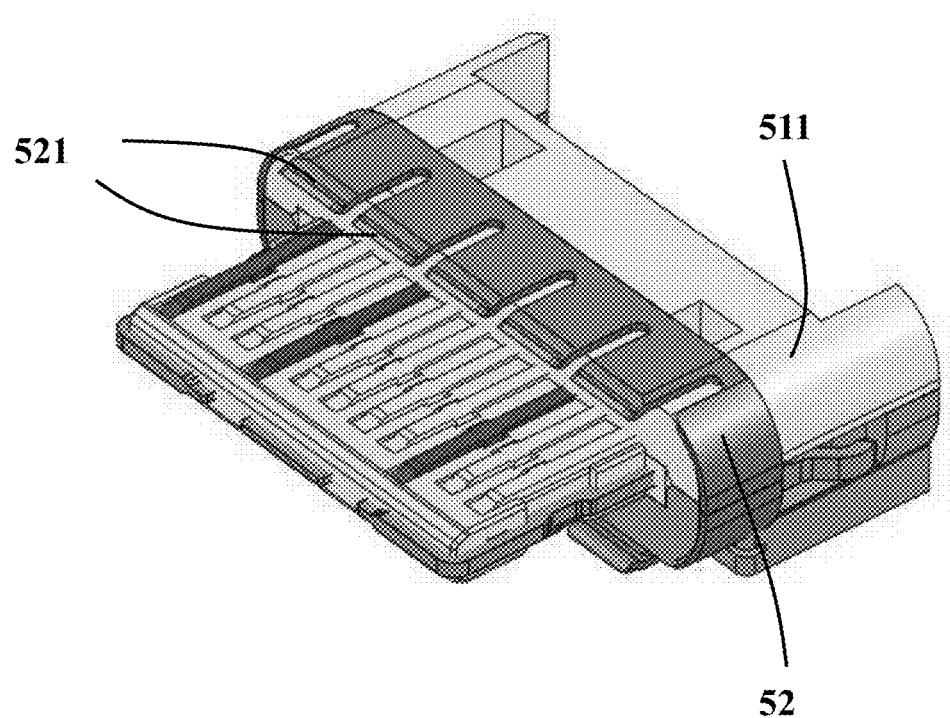
FIG. 16 is a perspective view of the receptacle connector of a fifth embodiment without the metallic shell thereof.
Figure 17:
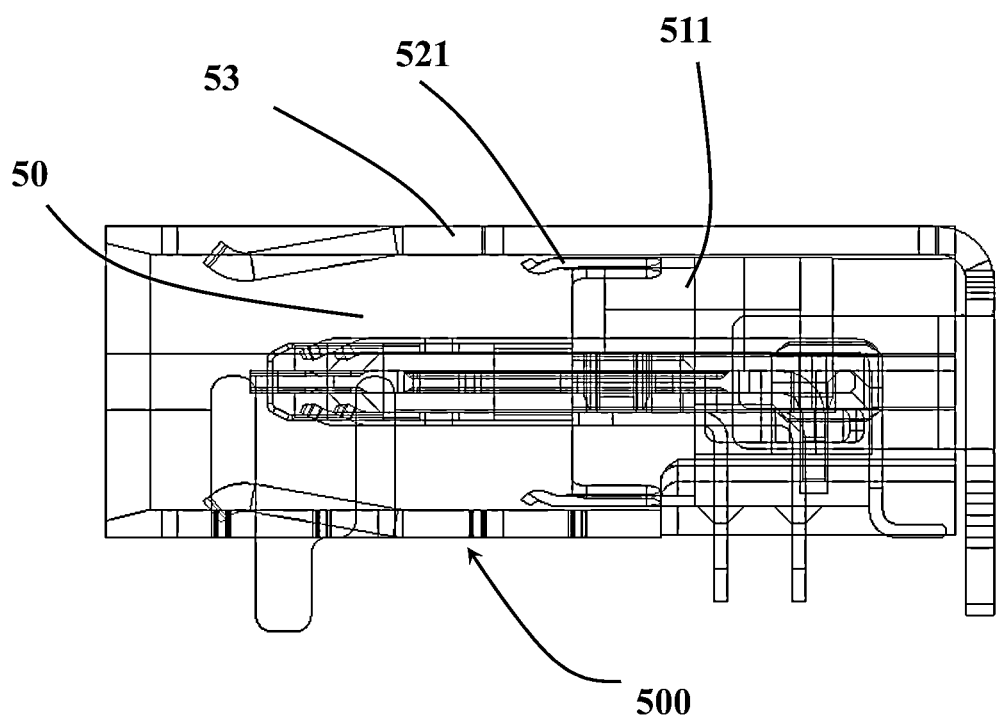
FIG. 17 is an illustrate view of the receptacle connector with metallic shell of FIG. 16.
Figure 18:
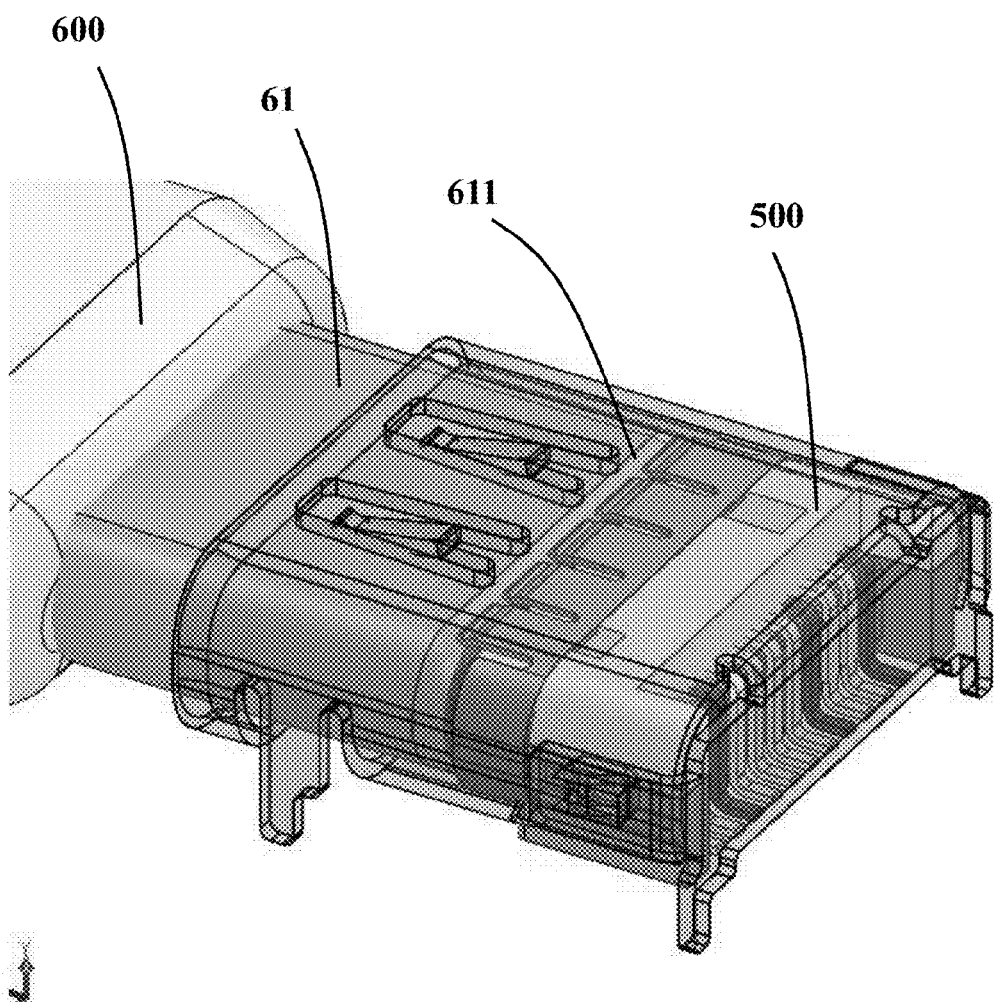
FIG. 18 is an illustrative view of the mated receptacle connector and the complementary plug connector of the fifth embodiment.
Figure 19:
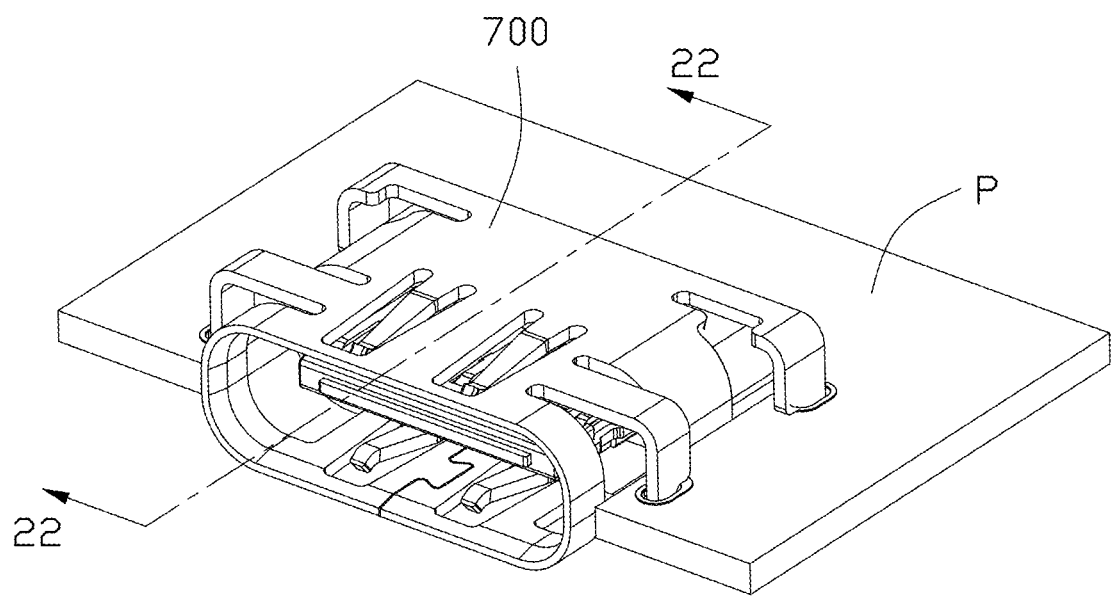
FIG. 19 is an assembled perspective view of a receptacle connector of the sixth embodiment mounted on the printed circuit board.
Figure 20:
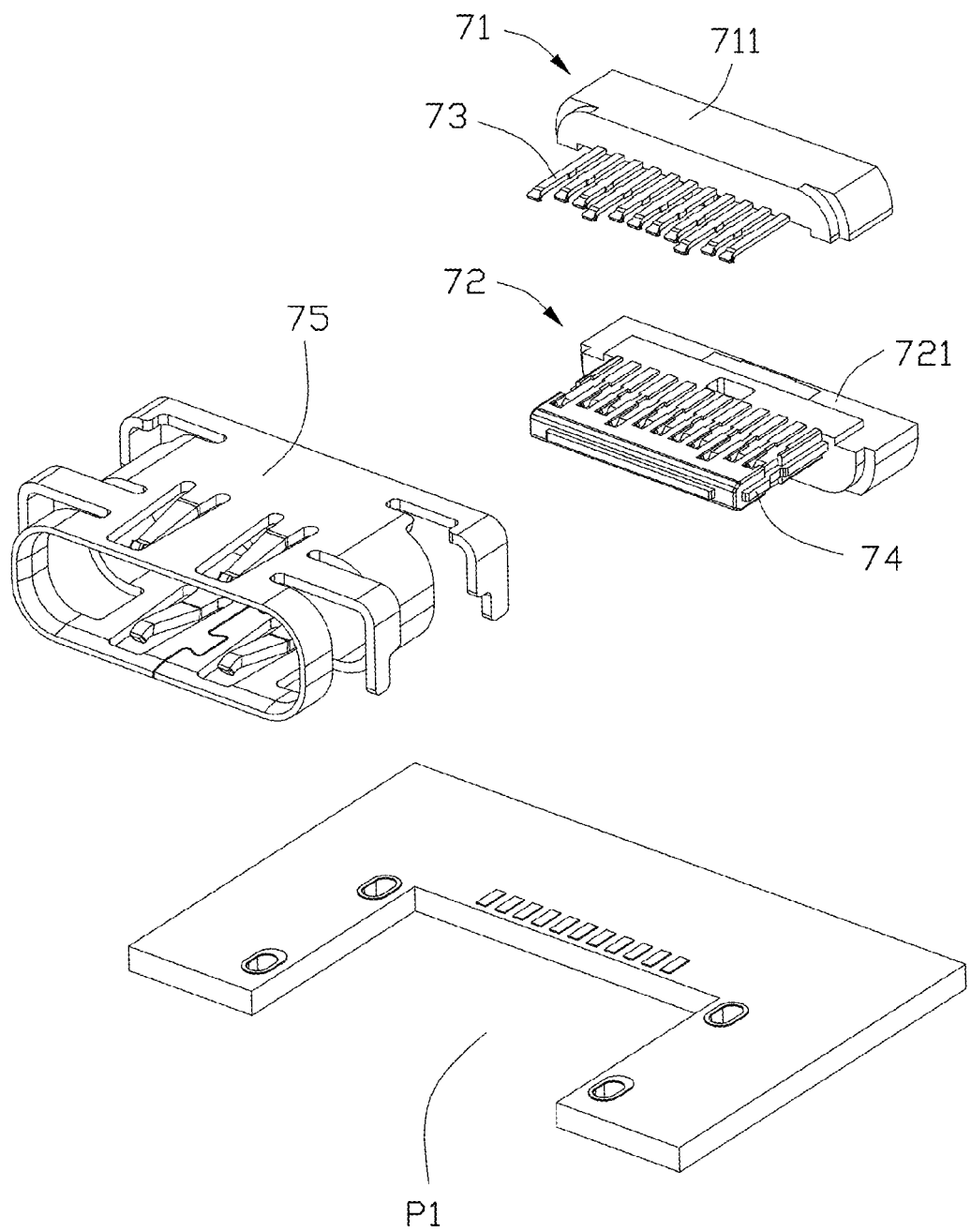
FIG. 20 is a partially exploded perspective view of the receptacle connector and the printed circuit board of FIG. 19.
Figure 21:
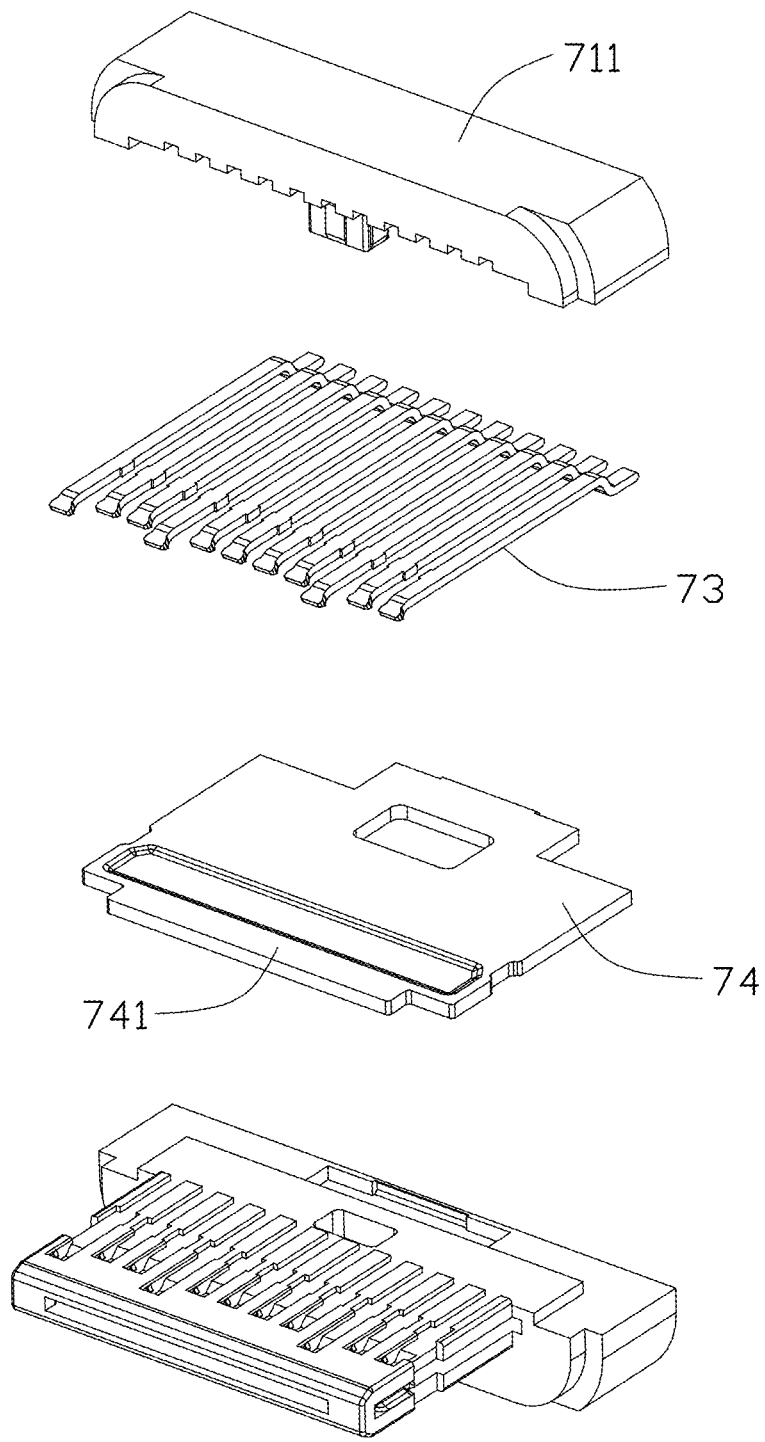
FIG. 21 is an exploded perspective view of the terminal seat of the receptacle connector of FIG. 20.

FIGS. 16-18 shows a receptacle connector 500 of a fifth embodiment, which includes a metallic bracelet 52 sandwiched between the insulative base 511 and the metallic shell 53 with a plurality of forwardly extending spring fingers 521 extending into the mating cavity 50 so as to abut against an exterior surface of the bull-nose tip region 611 of the metallic shell 61 of the complementary plug connector 600 for EMI/RFI protection wherein the bracelet 51 is much thinner and more flexible than the shell 53.

Figure 22:
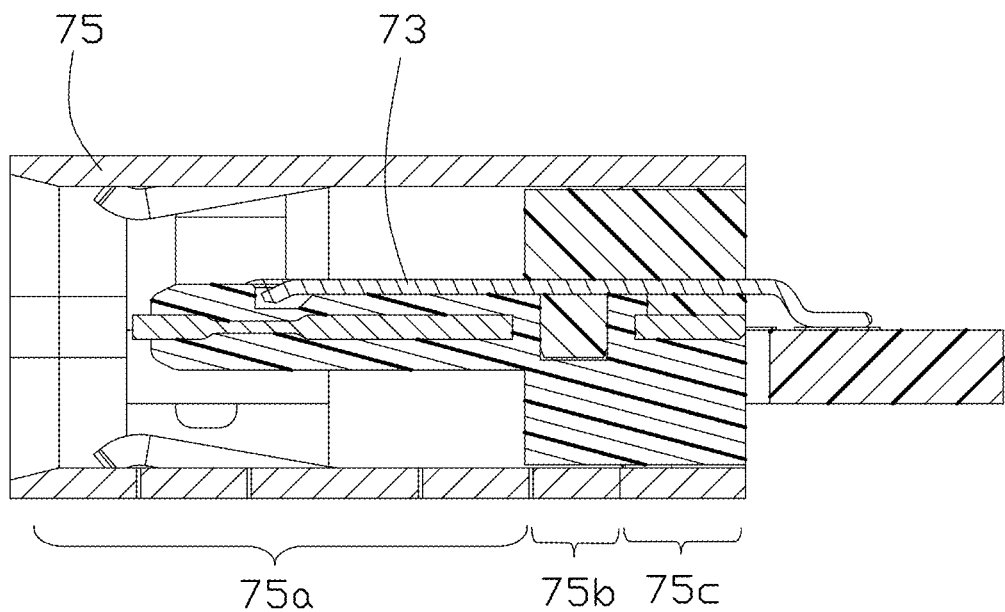
FIG. 22 is a cross-sectional view of the receptacle connector mounted on the PCB taken along lines 22-22 of FIG. 19.
Figure 23:
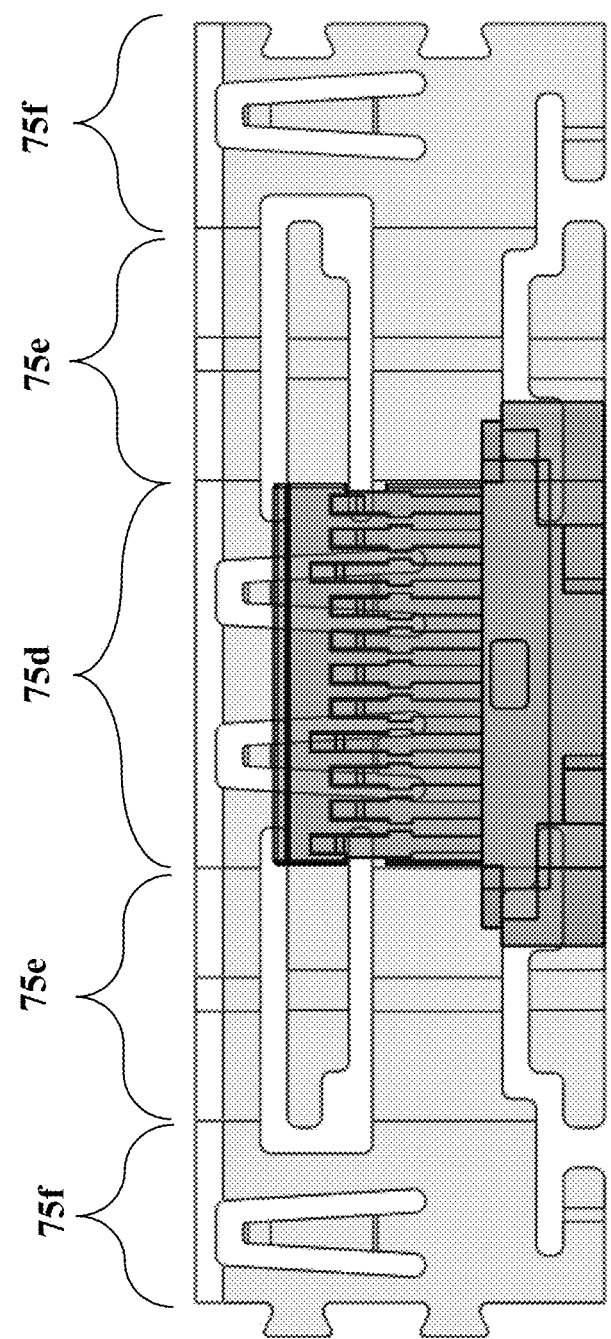
FIG. 23 is an elevational view of the shell and the housing of FIG. 19 wherein the shell is extended in a plane to show how to make a robust connector.

FIGS. 19-25 show a receptacle connector 700 of a sixth embodiment another which is mounted on a notch P1 of the PCB P. The receptacle connector 700 includes a top insert molding part 71 composed of the contacts 73 retained by the top insulative housing 711, and a main insert molding part 72 composed of the reinforcement metallic plate 74 enclosed in the main insulative housing 721. The top insert molding part 71 is downwardly assembled upon the main insert molding part 72 and commonly enclosed by a metallic shell 74 for mounting to the printed circuit board P1. As best shown in FIG. 22, the contacts 73 are embedded in a bottom of the top insulative housing 711 with a compared simply manufacture process. The shielding plate 74 has a central front projection 741 beyond a corresponding front face of a mating tongue of the main insert molding part 72. In this embodiment, the main insert molding part has no contacts thereon as best shown in FIG. 22 while maybe equipped with contacts, if necessary. Notably, similar to the previous inventions, the shielding plate 74 forms a pair of notches (not labeled) in two opposite lateral sides for locking with a pair of latches of the complementary plug connector.

Figure 24:
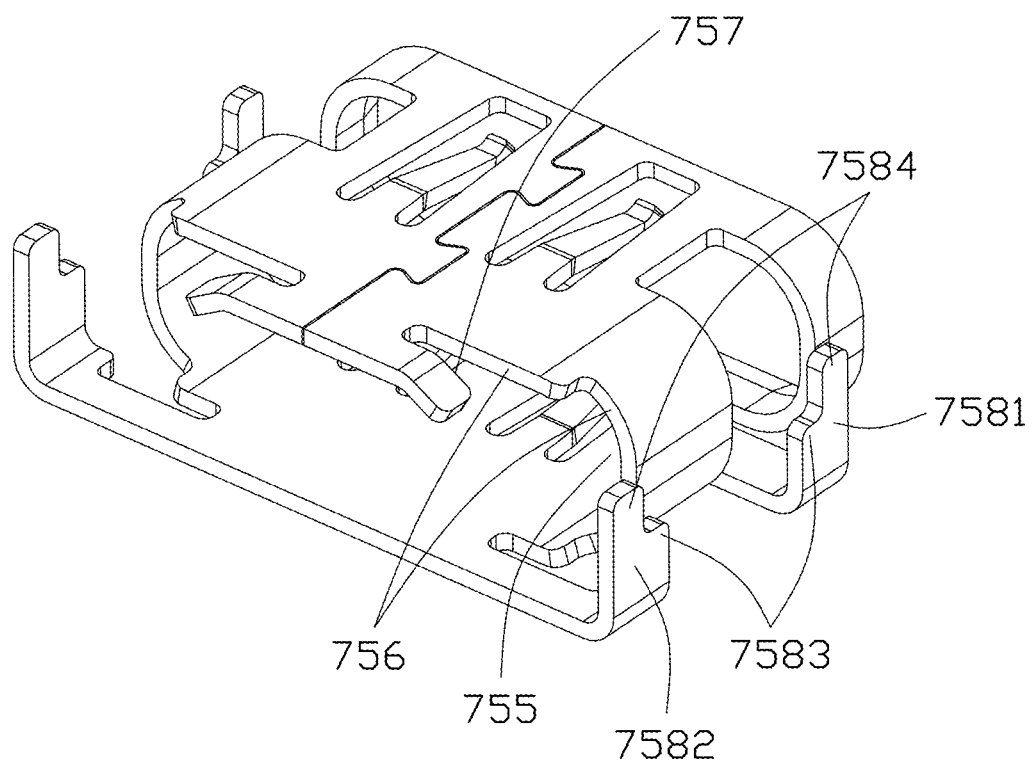
FIG. 24 is an upside down perspective view of metallic shell of the receptacle connector of FIG. 19.
Figure 25:
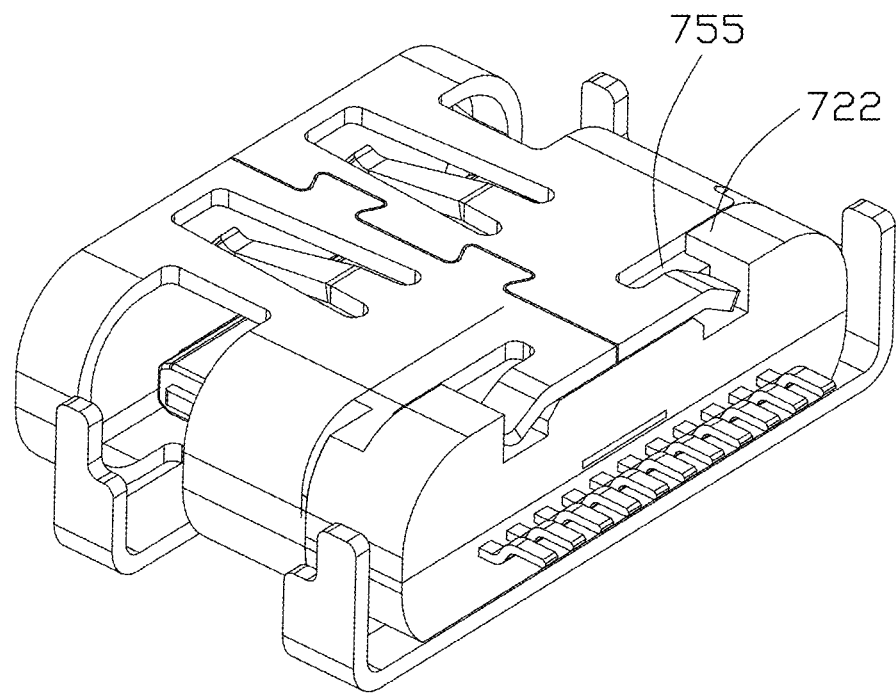
FIG. 25 is an upside down perspective view of receptacle connector of FIG. 19.
Figure 26:
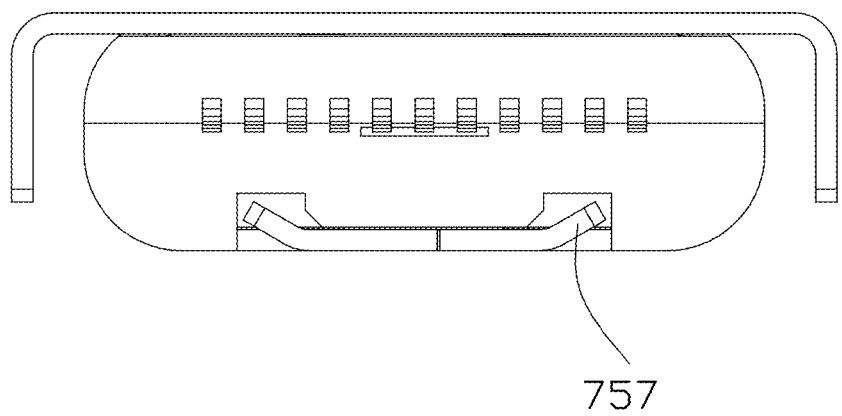
FIG. 26 is a front elevational view of the receptacle connector of FIG. 25.
Figure 27:
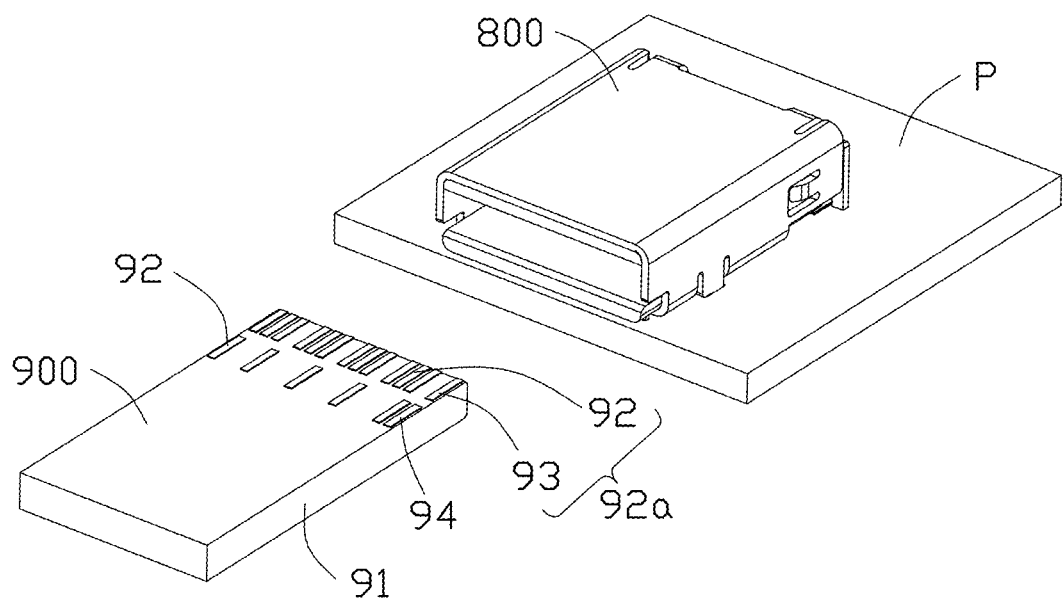
FIG. 27 is a perspective view of a receptacle connector mounted on the printed circuit and a plug connector of a seventh embodiment of the instant invention.
Figure 28:
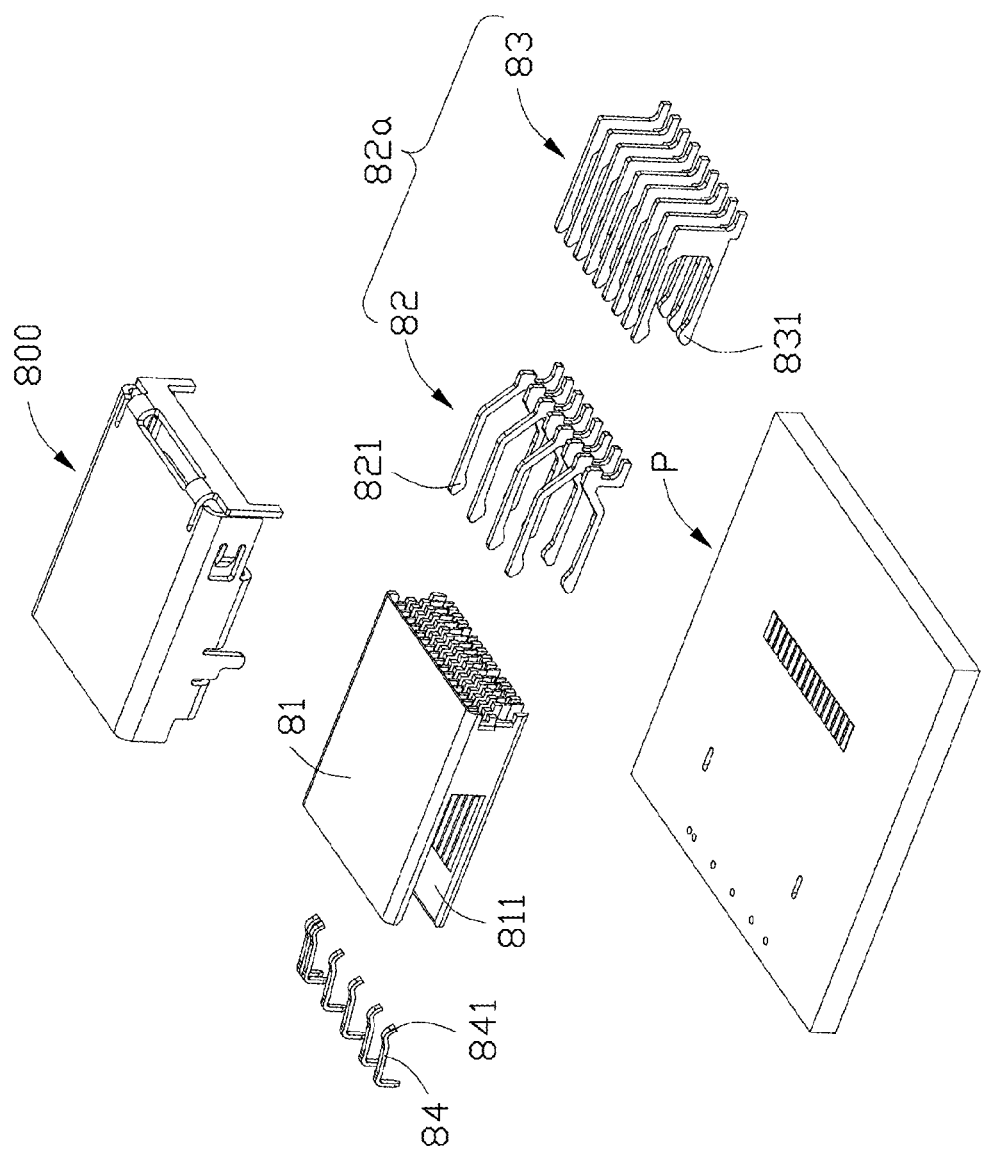
FIG. 28 is an exploded perspective view of the receptacle connector and the printed circuit board of FIG. 27.
Figure 29:
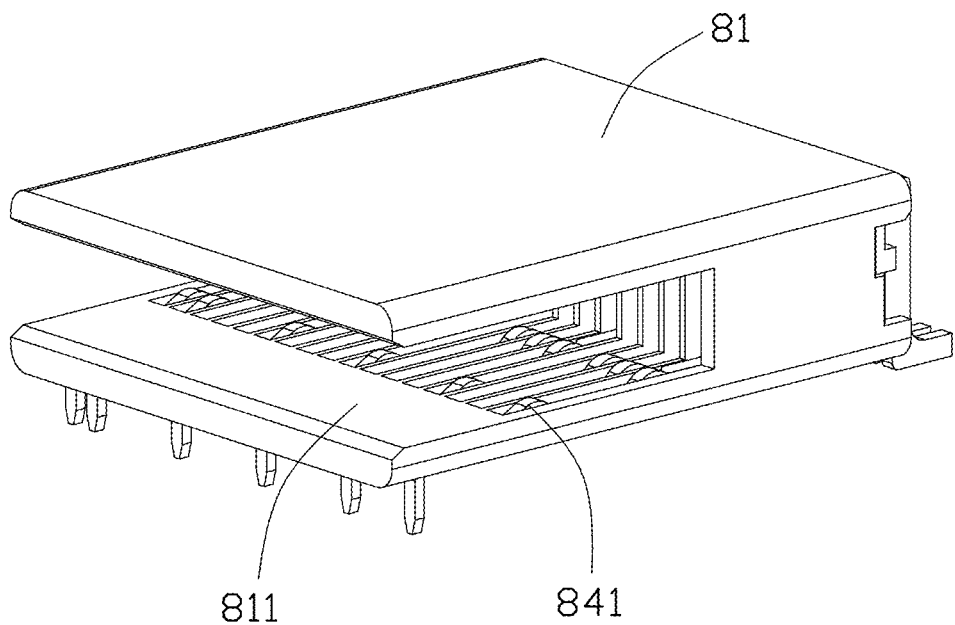
FIG. 29 is a perspective view of the receptacle connector of FIG. 27 without metallic shell to show how the contacts are disposed/assembled in the housing.
Figure 30:
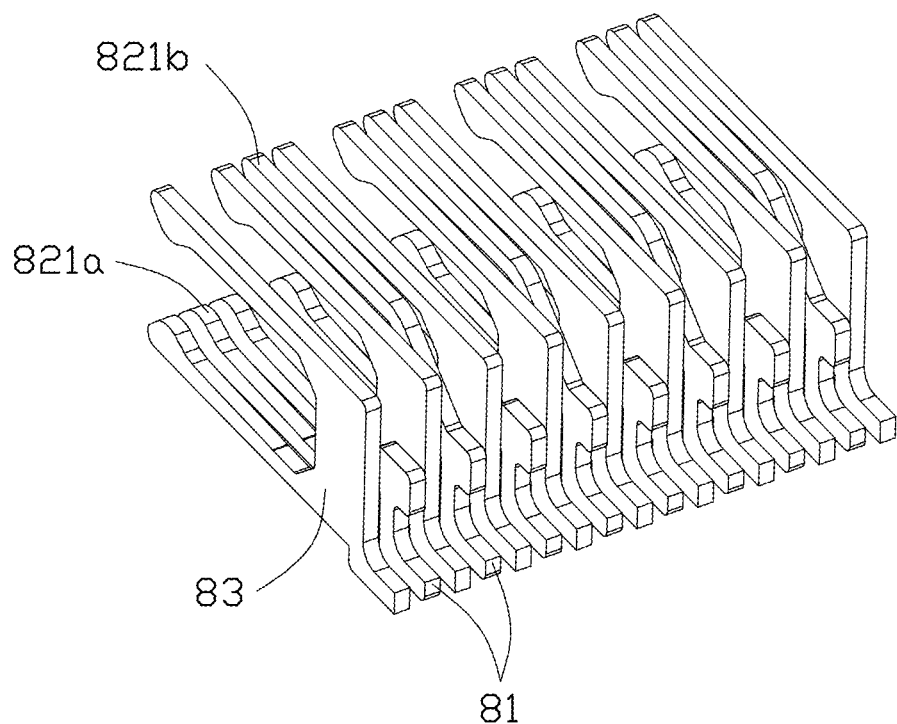
FIG. 30 is a perspective view of the contacts of the receptacle connector of FIG. 27 to show the balanced arrangement thereof.
Figure 31:
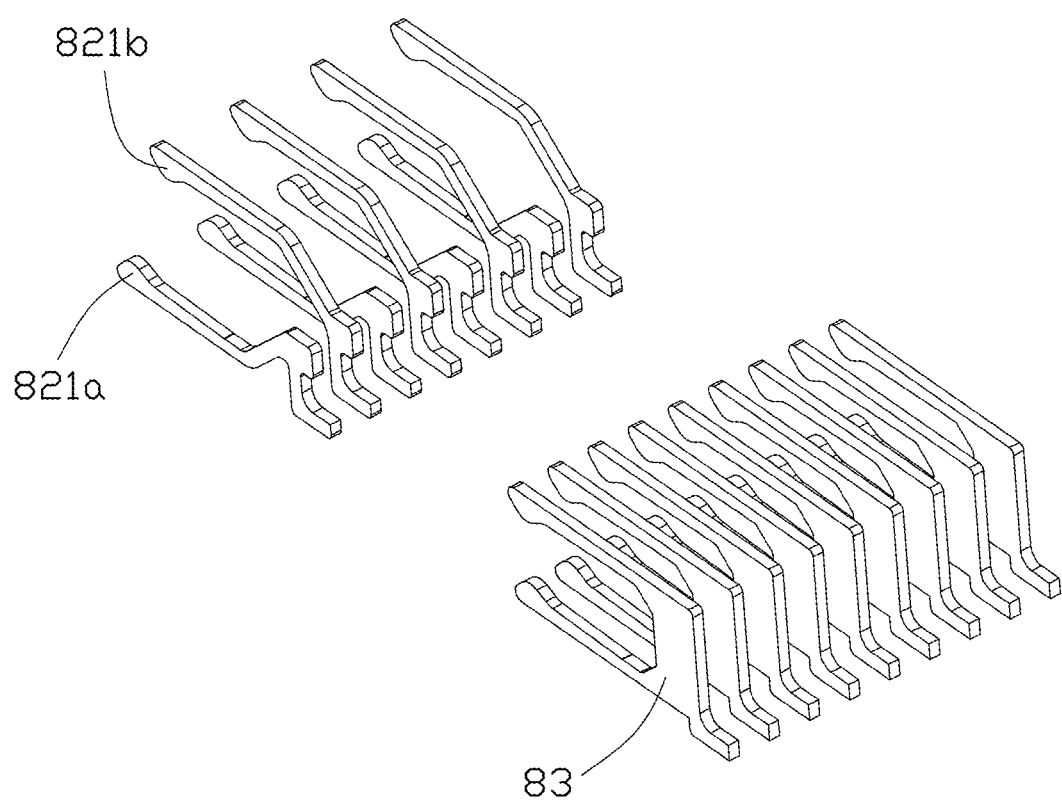
FIG. 31 is an exploded perspective view of the contacts of the receptacle connector of FIG. 30.
Figure 32:
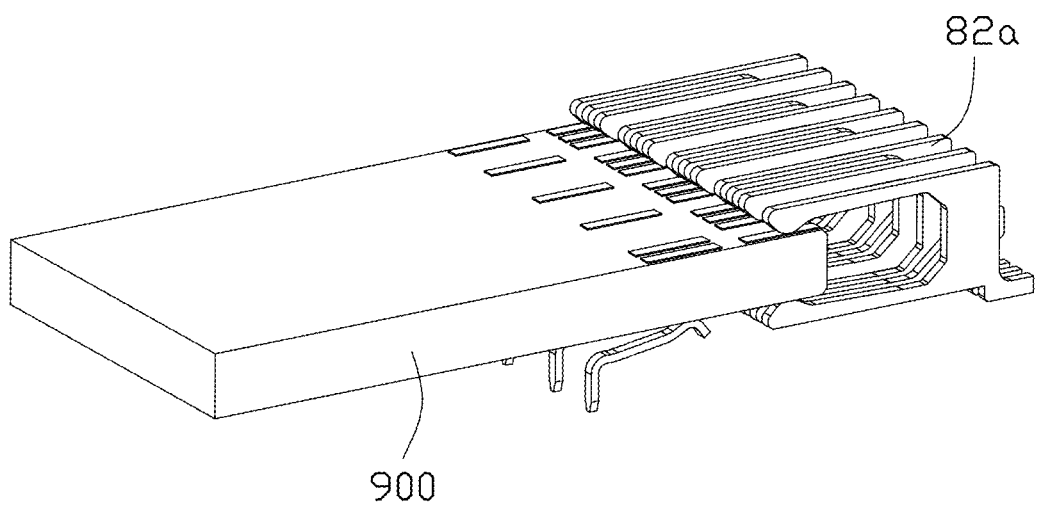
FIG. 32 is a top perspective view of the mated paddle card of the plug connector and the contacts of the receptacle connector.
Figure 33:
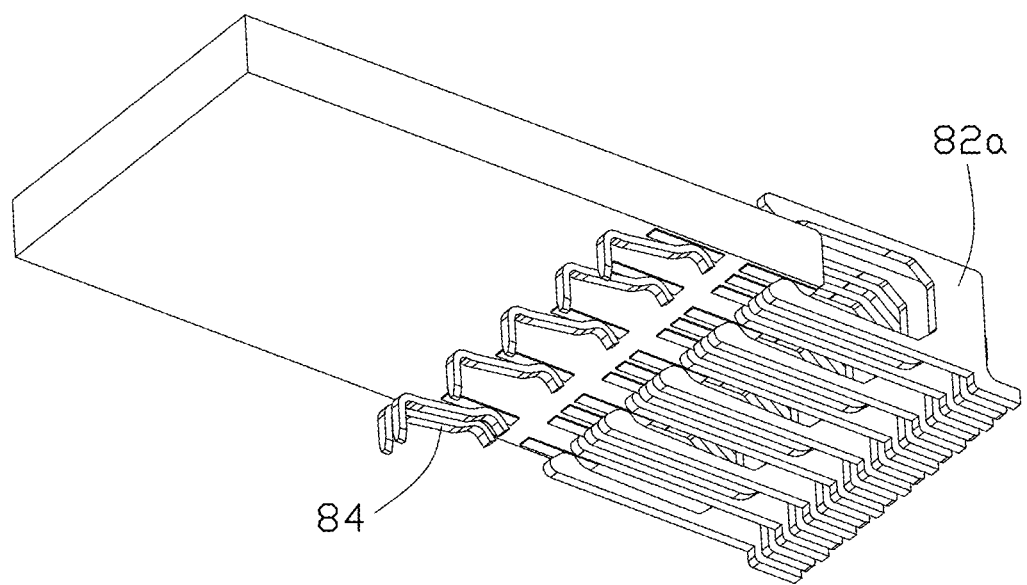
FIG. 33 is a bottom perspective view of the mated paddle card of the plug connector and the contacts of the receptacle connector.

The shell 75 may be categorized with a front tongue function region 75a, a middle retention region 75b for the vertical direction and the transverse direction, and a rear retention region 75c for the front-to-back direction, referring to FIG. 22 along the front-to-back direction. On the other hand, referring to FIG. 23, the shell 75 in an extended manner may be categorized with the top wall region 75d, the pair of side wall regions 75e and the pair of bottom wall region 75f. Referring to FIGS. 24-26, the shell 75 defines a pair of recesses 755 to receive a pair of corresponding protrusions 722 of the housing wherein the shell 75 defines a front stopper 756 to limit the forward movement of the protrusion 722, and a rear stopper 757 to limit the rearward movement of the housing. The shell 75 further includes a pair of front mounting legs 7581 and a pair of rear mounting legs 7582 wherein each of the mounting legs 7581 and 7582 defines a standoff region 7583 seated upon the printed circuit board and a leg 7584 inserted into and soldered within the corresponding hole (not shown) in the printed circuit board. The robust structure between the shell 75 and the housing may maximize the dimension of the whole connector while still keeping the required retention strength between the shell 75 and the housing, and that between the shell 75 and the printed circuit board.

Referring to FIGS. 27-33, a receptacle connector 800 of a seventh embodiment is mounted on an upper surface of the printed circuit board P and mated with a paddle cards 91 of a plug connector 900. The receptacle connector 800 includes an insulative housing 81 defining a receiving slot 811 extending in a transverse direction, a plurality of primary contacts 82a disposed in the housing and by two sides of the receiving slot 811. The primary contacts 82a are categorized with the signal/differential pair contacts 82 and the grounding/power contacts 83 alternately arranged with each other in the transverse direction wherein the signal/differential pair contacts 82 define corresponding contacting sections 821 exposed on one side of the receiving slot 811 alternately while the grounding/power contacts 83 define the corresponding contacting sections 8312 each exposed upon both two opposite sides of the receiving slot 811. In this embodiment, each differential pair contacts 82 have the corresponding contacting sections 821a, 821b exposed upon two opposite sides of the receiving slot. An additional array of secondary contacts 84 are disposed in the housing 81 with corresponding contacting sections 841 in front of said primary contacts 82a and only located on one side of the receiving slot 81.

The flippable plug connector 900 includes a paddle card 91 adapted to be directly coupled to the receptacle connector 800 and defines a primary pads 92 thereon in a front region. Those primary pads 92a are categorized with the signal/differential pair pads 92 and the grounding/power pads 93 alternate arranged with each other along the transverse direction wherein the signal/differential pair pads 92 are alternately arranged with one another on opposite surfaces of the paddle card 91 while each of the grounding/power pads 93 is exposed upon both opposite surfaces of the paddle card 91 for mechanically and electrically connecting to the connecting sections of the corresponding signal/differential pair contacts 82 and those of the grounding/power contacts 83, respectively. An additional array of pads 94 is located behind the primary pads 92a for electrically and mechanically connecting to the corresponding contacting sections 941 of the secondary contacts 84, respectively.

However, the disclosure is illustrative only, and changes may be made in detail, especially in matter of shape, size, and arrangement of parts within the principles of the invention.

What is claimed is:

1. A receptacle connector adapted for engagement with a complementary plug connector, comprising:
    an insulative housing defining a base and a mating tongue forwardly extending therefrom;
    a plurality of contacts disposed in the housing with contacting sections exposed upon the mating tongue;
    a metallic shield enclosing the housing to define a mating cavity in which the mating tongue is disposed; and
    an EMI element being assembled to the base to cover opposite top and bottom surfaces; wherein
    the EMI element defines a plurality of spring tangs to be seated around a rear portion of the mating tongue so as to allow a curved tip of a shell of the complementary plug connector to abut against either an exterior surface or an interior surface of the spring tang for EMI/RFI protection; wherein
    the EMI element is of a one-piece U-shaped metallic plate rearwardly assembled to the base, the plurality of spring tangs split from the plate and seated upon the root portion of the mating tongue for EMI/RFI protection; wherein
    the EMI element is of a pair of metallic bracelet, the metallic bracelets is assembled to the base from top and bottom side of the insulative housing.

2. The receptacle connector as claimed in claim 1, wherein a vertical portion of the U-shaped metallic plate is sandwiched between the base and the shell of the complementary plug connector in a front-to-back direction.

3. The receptacle connector as claimed in claim 1, wherein the EMI element is of a metallic bracelet attached upon a front portion of the base, the plurality of spring tangs extending from the bracelet into the mating cavity, the bracelet cooperates with the shielding of the receptacle connector to sandwich the shell of the complementary plug connector.

4. The receptacle connector as claimed in claim 1, wherein said EMI element further includes a rearwardly extending portion sandwiched between the shielding and the base.

5. An electrical connector assembly comprising:
    an insulative receptacle housing defining a base and a mating tongue forwardly extending therefrom;
    a plurality of receptacle contacts disposed in the receptacle housing with contacting sections exposed upon the mating tongue;
    a metallic shield enclosing the receptacle housing to define a mating cavity in which the mating tongue is disposed;
    a shielding plate embedded within a mid-level of the mating tongue and equipped with a pair of immoveable locking notches in two opposite lateral sides;
    a complementary plug connector comprising:
    an insulative plug housing adapted to be received within the mating cavity and defining a receiving cavity configured to be adapted to receive said mating tongue;
    a plurality of plug contacts disposed in the plug housing adapted to mate with the receptacle connector, respectively,
    a metallic latch including a pair of resilient latching arms adapted to be engaged within the corresponding notch during mating;
    a printed circuit board located behind the plug connector, tails of the plug contacts being mounted around a front region of the printed circuit board; and a cable including a plurality of wires mechanically and electrically connected to a rear region of the printed circuit board; wherein the latch defines a rear edge mechanically and electrically connected to a grounding pad formed on a front edge of the printed circuit board.

6. The electrical connector assembly as claimed in claim 5, wherein a metallic EMI bracelet encloses a front end region of an exterior surface of the plug housing with a plurality of spring fingers extending through corresponding slots formed in the front edge region of the plug housing and into the receiving cavity.

7. An electrical connector assembly comprising:

a receptacle connector including an insulative housing defining a receiving cavity extending in a transverse direction, a plurality of primary contacts disposed in the housing and by two opposite sides of the receiving cavity;

said contacts being categorized with the signal/differential pair contacts and the grounding/power contacts alternately arranged with each other in the transverse direction, the signal/differential pair contacts defining corresponding contacting sections alternately exposed on one of said two opposite side of the receiving cavity alternately while the grounding/power contacts define the corresponding contacting sections each exposed upon both two opposite sides of the receiving cavity; wherein an additional array of secondary contacts are disposed in the housing with corresponding contacting sections in front of said primary contacts and only commonly located on one side of the receiving cavity; wherein a flippable plug connector including a paddle card adapted to be received within the receiving cavity and defining a primary pads thereon in a front region, said primary pads are categorized with the signal/differential pair pads and the grounding/power pads alternate arranged with each other along the transverse direction, the signal/differential pair pads being alternately arranged with one another on opposite surfaces of the paddle card while each of the grounding/power pads is exposed upon both opposite surfaces of the paddle card.

8. The electrical connector assembly as claimed in claim 7, further including an additional array of pads is located behind the primary pads.

* * * * *